(12) United States Patent
Van Montfort et al.

(10) Patent No.: US 7,433,202 B2
(45) Date of Patent: Oct. 7, 2008

(54) ELECTRONIC DEVICE AND METHOD OF MANUFACTURING THEREOF

(75) Inventors: Vincent Johannes Jacobus Van Montfort, Heerlen (NL); Fransiscus Gerardus Coenradus Verweg, Heerlen (NL); Roel Henri Louis Kusters, Heerlen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 64 days.

(21) Appl. No.: 10/575,582

(22) PCT Filed: Oct. 11, 2004

(86) PCT No.: PCT/IB2004/052051

§ 371 (c)(1),
(2), (4) Date: Apr. 11, 2006

(87) PCT Pub. No.: WO2005/039260

PCT Pub. Date: Apr. 28, 2005

(65) Prior Publication Data
US 2007/0075034 A1    Apr. 5, 2007

(30) Foreign Application Priority Data
Oct. 15, 2003    (EP)    ................... 03103824

(51) Int. Cl.
*H01R 9/00*    (2006.01)
(52) U.S. Cl. ............ 361/772; 361/761; 361/762; 361/763; 361/764
(58) Field of Classification Search ............ 349/58; 361/761, 772, 762, 763–764; 235/492
See application file for complete search history.

(56) References Cited

U.S. PATENT DOCUMENTS

| | | | | |
|---|---|---|---|---|
| 5,013,900 | A | * | 5/1991 | Hoppe .................... 235/492 |
| 5,677,568 | A | * | 10/1997 | Ochi et al. ................ 257/679 |
| 7,084,935 | B2 | * | 8/2006 | Mandler et al. ............. 349/58 |
| 2003/0169575 | A1 | * | 9/2003 | Ikuta et al. ................ 361/761 |

* cited by examiner

*Primary Examiner*—Jeremy C. Norris
*Assistant Examiner*—Andargie M Aychillhum
(74) *Attorney, Agent, or Firm*—Michael E. Belk

(57) ABSTRACT

The electronic device comprises a body (40) of electrically insulating material that is provided with a through-hole or cavity. In the cavity or through-hole an electric component (20) is present. This component is attached to the body through an attachment layer (13). The surface of this attachment layer is provided with a pattern of electrical conductors for electrically coupling the component to other components and/or contact means for external coupling. At least one of which electrical conductors extends to a surface of the body.

14 Claims, 3 Drawing Sheets

ELECTRONIC DEVICE AND METHOD OF MANUFACTURING THEREOF

The invention relates to an electronic device comprising a body of electrically insulating material and an electric component, which body comprises a pattern of electrical conductors for electrically coupling the component to other components and/or contact means for external coupling The invention also relates to a method of manufacturing an electronic device comprising a body of electrically insulating material provided with a pattern of electrical conductors, said method comprising the steps of:

- providing a carrier with at a first side the pattern of electrical conductors and at an opposed second side a sacrificial layer;
- mounting a first electric component at the first side of the carrier, therewith also providing electrical coupling from the component to contact pads in the pattern of conductors
- providing the body of electrically insulating material in a moulding process at the first side of the carrier, and
- removing the sacrificial layer of the carrier.

Such an electronic device and such a method are known from U.S. Pat. No. 5,738,797. The electric component in the known device is a resistor. The adhesion of the body to the carrier is herein improved, in that the sacrificial layer is pre-etched before the provision of the body, herewith enabling mechanical anchoring of the conductors in the body.

It is a disadvantage that the inclusion of electric components in the body limits the choice of materials for the body. Particularly thermoplastic materials do not always adhere sufficiently to the embedded components and/or the conductors. This may result in delamination of the conductors from the body. The problem is more pronounced, if more components are to be embedded in the body.

It is therefor a first object to provide an electronic device of the kind mentioned in the opening paragraph, in which this problem is prevented and which nevertheless may have a shape that is most suitable for its application.

This first object is achieved in that the body is provided with a through-hole or cavity, in which the electric component is present, the component being attached to the body through an attachment layer, provided with a pattern of electrical conductors is provided for electrically coupling the component to other components and/or contact means for external coupling, at least one of which electrical conductors extends into the body and is connected to a further conductor that is embedded in the body and is at least partially exposed to a surface of the body.

The device of the invention solves the problem in that the component is kept outside of the body of electrically insulating material, but is not outside the shape of the body. Contrarily, the body is provided with a through-hole. The component can be fixed in the through-hole due to the attachment layer. The attachment layer is thus a second body. It will be mechanically and/or chemically fixed to the body. The attachment layer may fully encapsulate the component, but this is not preferred. The presence of air is, in the opinion of the inventors, suitable to prevent mechanical stresses. If the attachment layer would fill the through-hole in the body, differences in thermal expansion coefficients may give rise such mechanical stresses in a direction lateral to the plane of the conductors. Furthermore, where the attachment layer does not fill the through-hole, and has thus a reduced thickness in comparison to the body, it can be overmoulded by the body more easily. This improves the adhesion between both, as the attachment layer may well extend into the body.

Another advantage of the non-encapsulation is the improved flexibility regarding the component. Particularly for optical applications, but also for various sensing applications, a free surface is highly preferred.

The attachment layer can be chosen from various types of material. A suitable material is a material that can be patterned in a lithographic process, such as a photoresist material or equivalent, such as photosensitive benzocyclobutene, solder resists and the like. An alternative is a material that will melt on gentle heating, for instance to about 100° C., and be cured thereafter. Such a material is for instance an acrylate, as described per se in the non-prepublished application WO-IB 03/02292 (PHNL020471). It has the advantage that on melting a component will sink into the attachment layer. Not only do any solder or metal balls then make electrical contact to conductors in the pattern, but also is the adhesion of the component to the attachment layer established. Such a layer will extend into the body. Due to the curing possibility, the attachment layer can be crosslinked to the material of the body. Other suitable material are for instance those used for underfilling in the packaging of semiconductor devices.

In a suitable embodiment, the body further comprises embedded components, which are coupled electrically to the same pattern of electrical conductors as the not encapsulated component. Generally, various kind of components with different sizes are needed. This embodiment is advantageous for the manufacturing, in that all components may be mounted in the same process, whereafter some of them will be encapsulated in the body, but others will not. As a consequence, flexibility is provided herewith together with cost reduction.

In another embodiment, the component is chosen from the group of optically active and optically sensitive components. Such components include photodiodes, laser diodes, light emitting diodes, image sensors, variable focus lenses and displays. The device of the invention allows the integration of such components in a very efficient manner. The presence in a through-hole in the body of electrically insulating material allows the light to come in or/and to go out through the aperture in the through-hole. As will be understood, this component may be provided with a suitable optically transparent package itself, such as a glass plate.

In a further modification hereof, the electrically insulating material of the body is an optically transparent material, and there is a light path to the component through the body of transparent material. This allows the provision of optical assemblies as part of the electronic device. Suitable examples include optical transmission, optimized light output based on input of a sensor, optical discs including an integrated circuit for copy protection and a photodiode for energy transfer to the integrated circuit; cameras; and modules comprising optical and other functionality. A very suitable embodiment includes a combination of light-emitting diodes and a display, wherein the diodes are used for backlighting.

This modification has a number of functional advantages. First of all, all relevant components are attached directly to one and the same carrier, which is the body. The margin of tolerance of the prior art, resulting from both the attachment of components to a board and the attachment of the board to the body is therewith reduced. Furthermore, the design of the pattern of conductors may be optimized, such that the optical elements are positioned as good as possible in relation to the display.

In another embodiment, the pattern of conductors extends in a first and a second plane, said planes including an angle unequal to 180°. This embodiment has a number of advantages. First of all, any components can be placed at locations, which are most favorable in view of their functions or in view of miniaturization. Secondly, any components can be placed under a desired angle with respect to a plane of attachment to a carrier. This is for instance suitable for antennas that are attached to or designed as part of the pattern of conductors. It is also very suitable for optically active and optically sensitive components. Thirdly, the components can be provided in different planes so as to minimize mutual interference. Furthermore, cavities can be provided in which external components may be placed and electrically connected afterwards.

Preferably the further conductor is a part of the pattern of conductors. As will be understood, the further conductor may be of any shape as desired and be split or extended as desired. It is then preferred that the pattern of conductors is mechanically anchored in the body and the attachment layer. This may be achieved, for instance with the method proposed in the mentioned prior art document. Furthermore, the pattern of conductors preferably comprises a number of strip-shaped conductors provided each with at least one region of larger dimensions than the width of the strip-shaped conductors. Such regions are suitable as contact pads. The pattern of conductors may be adapted so as to correspond to a ball grid array pattern of an integrated circuit. It is an advantage of the device of the invention that components can be attached to conductors of the pattern from both sides, i.e. at the first side before the provision of the body and at the second side after the provision of the body.

The body may have any shape that is desired in view of its application. It might well be the structural element of the device, therewith acting as carrier of the conductor pattern, as carrier of elements and for definition of the device. Particularly, it may provide the mutual interrelationship between different components that are part of the device. The device may include additional components, but does not need to include anything more than the body, the component and the attachment layer.

In addition to the body of electrically insulating material, further bodies may be present. It may well be that the optically transparent body is surrounding by bodies that are not optically transparent, but more suitable to encapsulate components with the desired chemical and thermal stability. Particularly, it is desirable to include any more advanced components, such as integrated circuits and other semiconductor devices in a thermosetting material, such as an epoxy. This material has optimized encapsulation properties in view of its widespread use in semiconductor industry. For the provision of desired shapes and functionality, it is preferred to use a thermoplast material, such as PPS. In a further embodiment one of such further bodies is flexible. This allows the inclusion of a flexible foil, that can be chemically and mechanically connected to the body of electrically insulating material.

In order to increase to functionality of the device with the body, it is desired to provide interconnects in the pattern of conductors. Such interconnects may be implemented in different manner, but most advantageously hidden in the body. This can be achieved by provide discrete elements that can be used as a cross-over. The element therewith may bridge a further conductor that is located in an area between the first and the second conductor which are interconnected with the cross-over. A first example of a discrete element is a block, the second example is a bond wire.

The discrete elements will have a sufficient distance to the third conductor in order to have sufficient isolation. In addition thereto, the area of the effective crossing can be made quite small, as the mechanical strength needed for the stability of the air bridge is not needed. If a block is used as a discrete component, the stability thereof results from other constituents than the conductive interconnect. If a bond wire is used as the discrete element, the area of crossing is anyhow small.

It is an advantage of the use of discrete elements, that no additional process step is needed if other passive and active elements are provided in the body anyhow. The discrete element can be chosen so as to be compatible with the connection technology used for the connection of the other elements.

The use of discrete elements is furthermore preferred over alternative cross-over connections that can be made in thin-film technology. First of all, the distance between the cross-over connection and the third conductor is relatively small if thin-film technology is used; the provided layers are relatively thin. Secondly, the layers provided with thin-film technology will hamper if not take away the effect of the mechanical anchoring.

It is a further advantage of the discrete elements that the conductors can form microstrips. Herein, an interconnect used for voltage supply is provided with neighbouring conductors that are grounded. In this manner, the electric losses of the conductors can be reduced. There is nothing against using a couple of discrete elements in parallel, so that all the interconnects of the microstrip are continuous in the same way. In case of blocks, the different cross-over connections can be integrated into a single block.

The use of discrete elements is particularly preferred for modules in which the body also defines the shape. In such modules, the density of conductors is relatively low, and the use of one or a small number of discrete elements suffices.

It is a further advantage of discrete elements, and particularly of bond wires, that they can be chosen so as to be part of a structure comprising a number of bond wires and a number of conductors. In this way, the length of the bond wires is chosen so as to provide a desired inductance. In a suitable embodiment, bond wires can be applied at the second side as well, after removal of the sacrificial layer. Also this second side may then be provided with electrically insulating material. The resulting device is then to be contacted at side faces.

Another increase in the functionality can be achieved with the incorporation of a shield. This shield, particularly against electromagnetic interference, can be provided around one or more of the bodies. A suitable manner of provision of the shield is to provide a layer of electrically conductive organic material first, and thereafter plating the conductive polymer. A suitable conductive organic material is for instance poly-(3,4-ethylenedioxy)thiophene. This material, as well as derivatives thereof can be applied onto a surface with a wet-chemical deposition method in that it is mixed with a poly-acid, such as polystyrenesulphonic acid. Through the addition of photochemical initiators it may be structured according to a desired pattern without an addition mask. Such a shield may be provided after removal of the sacrificial layer. Preferably, however it is used in that first a first body is provided, which leaves still some conductors exposed, and then the shield is provided, which is connected to a relevant number of said exposed conductors. After the plating a further body may be provided which can encapsulate the shield. As will be apparent, it is not strictly necessary for the application of a shield that a non-encapsulated component is present.

In a further embodiment, the attachment layer with the pattern of electrical conductors is a leadframe. The leadframe is suitably connected to the embedded further conductors, e.g. with solder or conductive adhesive. The advantage of a leadframe is that it allows placement of the component or the components before the assembly. The leadframe may be connected to several further conductors aternatively. The further conductors is by preference mechanically anchored in the body of insulating material and formed in an integrated process.

It is a second object of the invention to provide a method of manufacturing of the kind mentioned in the opening paragraph, with which the device of the invention can be provided, and the drawbacks of the prior art can be overcome.

This object is achieved in that it comprises the steps of:
providing a carrier with at a first side the pattern of electrical conductors and at an opposed second side a sacrificial layer;
providing an attachment layer at the first side;
mounting a first electric component at the first side of the carrier, therewith also providing electrical coupling from the component to contact pads in the pattern of conductors
providing the body of electrically insulating material in a moulding process at the first side of the carrier, such that the first component is kept outside the body, and
removing the sacrificial layer of the carrier at least partially.

The provision of the attachment layer enables the provision of the first electric component outside the body, while the mechanical stability is not endangered.

The removal of the sacrificial layer is preferably realized, at least partially, by etching. As the skilled person will understand, various materials may be used for the sacrificial layer. In one version, the sacrificial layer is of a different material than the electrical conductors. It may be, for instance, Al, or Ni, or Si, or an alloy including any of these materials or an inorganic material. In another version, a barrier layer is present between the sacrificial layer and the electrical conductors. A suitable barrier layer is for instance Al or an alloy thereof, if the conductors comprise Cu or NiPd or both. In such a case it is not necessary, that the sacrificial layer is removed completely. To realize such, a mask can be provided atop the sacrificial layer before integration into the device.

The removal of the sacrificial layer may also be effected partially before the provision of the mould. As a result, the pattern of conductors can be buried in those areas in which the sacrificial layer is removed. This allows the provision of a bridge covering a through-hole in the body from one side.

Mechanical anchoring of the conductors in the body may be achieved in that the sacrificial layer is pre-etched before the provision of the body and the attachment layer.

In a suitable embodiment a second electric component is mounted at the first side of the carrier before the provision of the body, which second component is thereafter encapsulated in the body. This has the advantage that both the first and the second component can be mounted in a single process. This reduces the assembly costs and complexity, and limits any tolerance margins. Furthermore, and not unimportant, it allows some testing before the provision of the body. The testing can be extended, if the sacrificial layer is electrically insulating or comprises adjacent to the conductors an electrically insulating layer.

In a further embodiment, the attachment layer is a leadframe and the attachement layer and the first electric component are assembled simultaneously electrical connection is then realized between the leadframe and the pattern of conductors.

These and other aspects of the device and the method of the invention will be further explained with reference to the figures, in which.

The same reference numerals will be used for equal parts in different figures. The figures are not drawn to scale and are purely diagrammatical. The figures show one example only, while others falling within the scope of the invention will be apparent to the skilled person.

Figure 1:
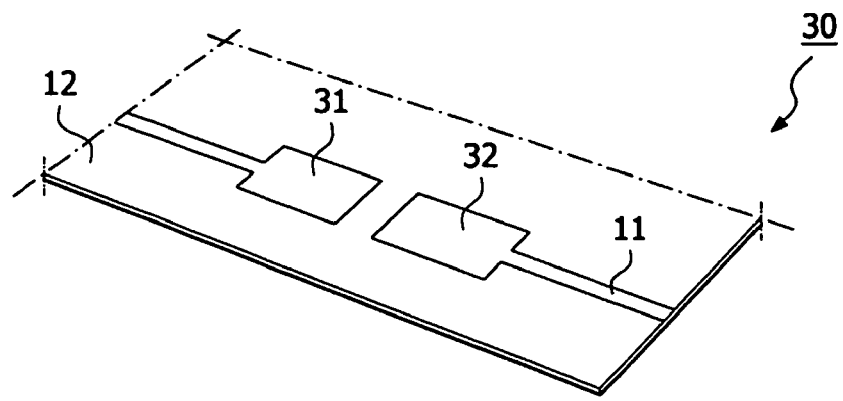
FIG. 1-4 show bird's eye views on the device of the invention in different stages of its manufacture.

FIG. 1 shows a carrier 30 with a sacrificial first layer 12 and a pattern of electrical conductors 11. The first layer comprises for instance Al, and the conductors comprise copper. Mechanical anchoring of the insulating material subsequently provided is achieved in that the Al is etched slightly with the conductors as etch mask prior to the provision of the insulating material. This leads to a desired amount of underetch. Alternatively, the first layer comprises Cu, and the conductors 11 comprise a stack of Au, Ni and Cu, wherein the Au and Ni layer are preferably thinner than the Cu layer. The conductors 11 are herein provided with a plating process instead of an etching process. A photoresist is herein used for the definition of the pattern of the conductors. As a consequence thereof that side walls in the apertures in the photoresist include an angle unequal to 90 degrees with respect to the first layer 12, the conductors 11 have a diameter that increases with increasing distance to the first layer 12. The angle is for instance between 60 and 85 degrees. This leads to anchoring. The conductors include areas 31,32 with a larger width, that are suitable for use as bond pads.

Figure 2:
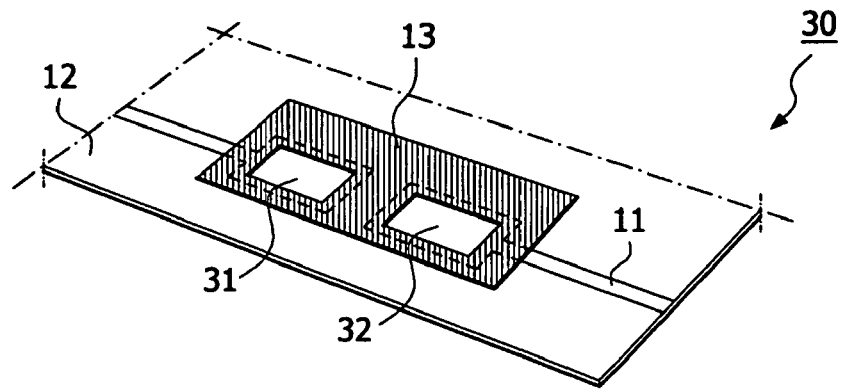
Figure 3:
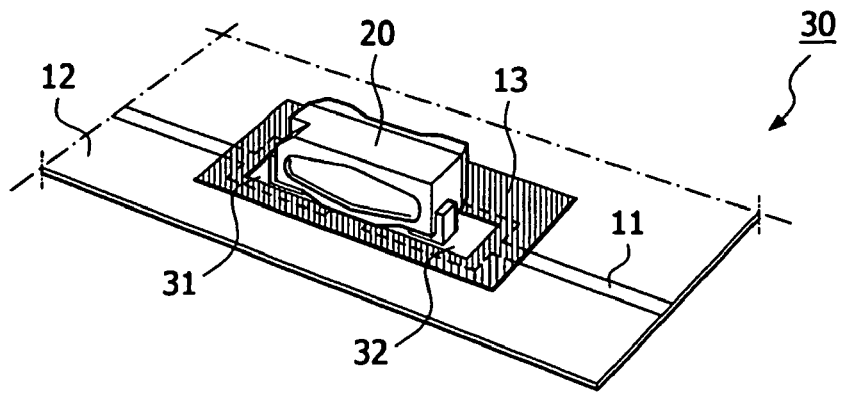

FIG. 2 shows a second stage, after that an attachment layer 13 is provided onto the carrier 30. In this case the attachment layer 13 comprises a solder resist and is provided in a desired pattern which leaves the bond pads 31,32 and possibly other areas exposed. FIG. 3 shows a third stage, after that a component 20 is provided on the carrier 30. In this case the component is a light-emitting diode, but that is not necessary. It is furthermore preferred that at this stage a plurality of components is mounted. The use of one mounting step that is defined on the basis of one pattern of conductors 11 diminishes any margin of tolerance in the assembly. Particularly for components that define together a functional entity, this reduction of tolerance will lead to a higher product quality.

Figure 4:
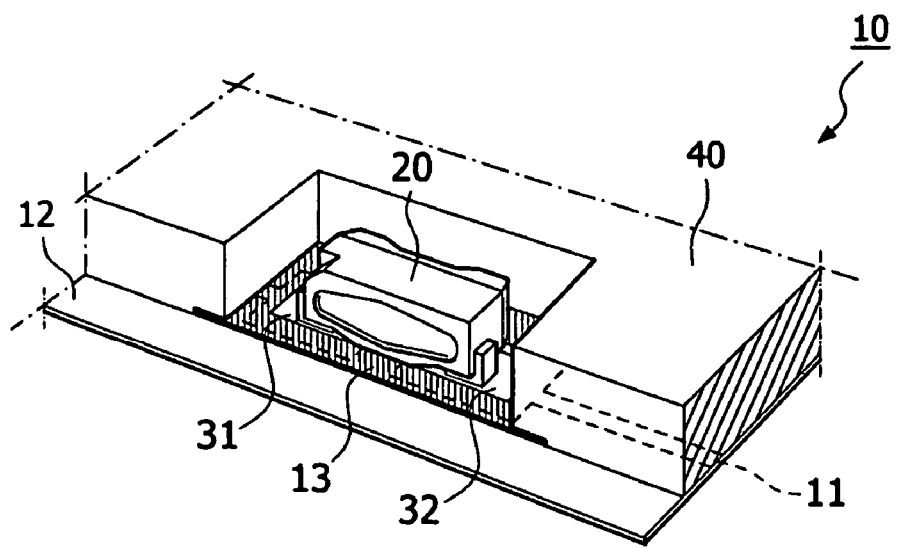

FIG. 4 shows a third stage in the manufacture, after that a body 40 of electrically insulating material is provided. The body 40 comprises in this case an epoxy.

Figure 5:
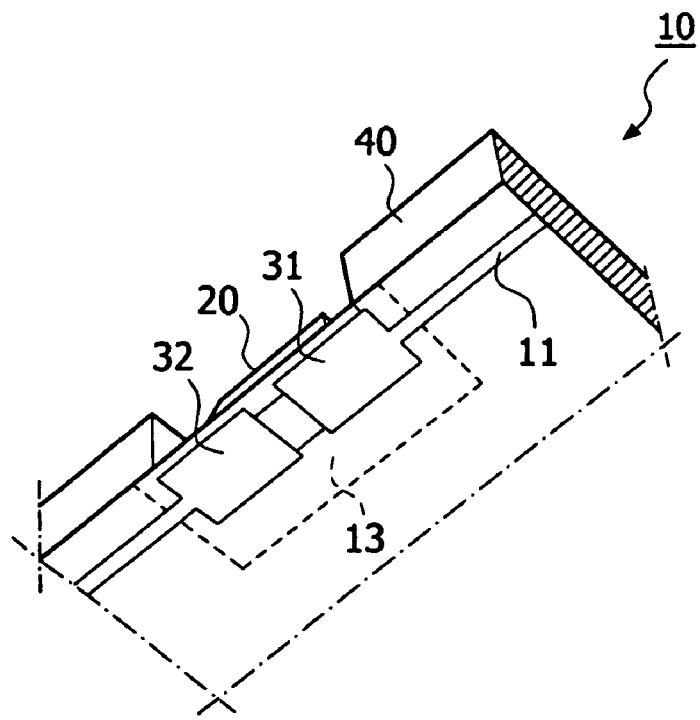
FIG. 5 shows a bird's eye view on the device of the invention.
Figure 6:
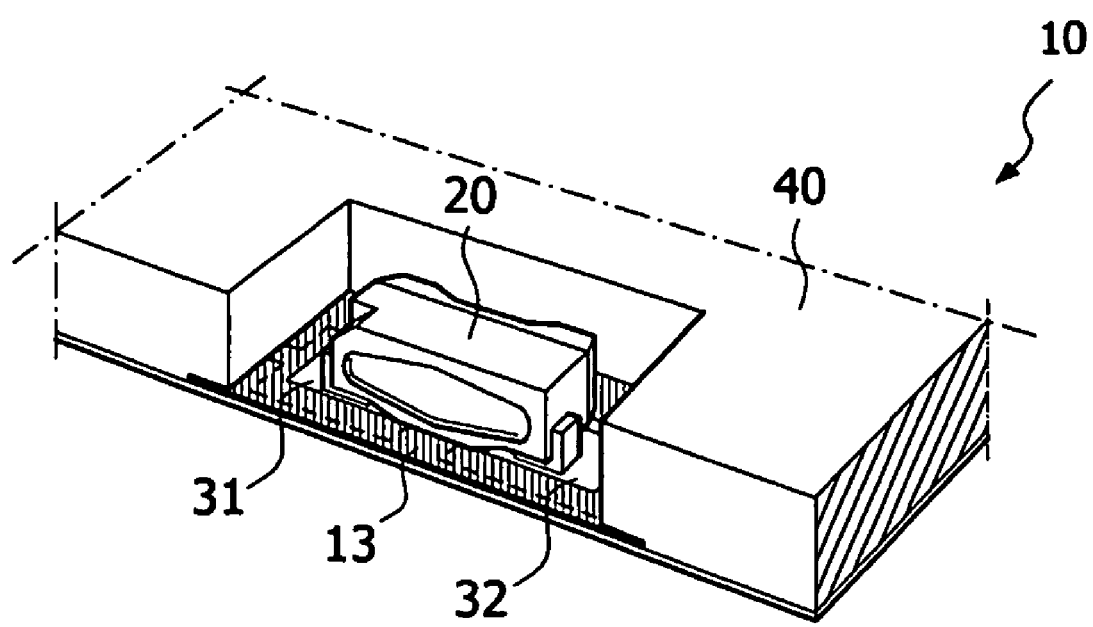
FIG. 6 shows a bird's eye view on the device from another direction.

FIGS. 5 and 6 shows the resulting device 10, after that the first layer 12 has been removed. The component 20 is now kept in a mechanically stable manner in the device 10 through the presence of the attachment layer 13 that is partially overmolded and thus well maintained in the body 40. The conductors 11 are herein present at the surface of the body, and may be include further contact pads for coupling to external components or an external board. Alternatively, an antenna or a flex foil may be present. It will be understood that the body as a whole can again be encapsulated in a further mould with any desired shape.

The invention claimed is:

1. An electronic device comprising a body of electrically insulating material that is provided with a through-hole or cavity, in which an electric component is present having a top portion, a bottom portion and side portions, the component being attached to the body through an attachment layer, provided with a pattern of electrical conductors for electrically coupling the component to other components and/or contact means for external coupling, at least one of which electrical conductors extends into the body and is electrically coupled to a further conductor that is embedded in the body and is at least partially exposed to a surface of the body, wherein the body only partially surrounds the side portions of the electric componet.

2. A device as claimed in claim 1, wherein the body further comprises embedded components, which are coupled electrically to the same pattern of electrical conductors.

3. A device as claimed in claim 1, wherein the component is chosen from the group of optically active and optically sensitive components.

4. A device as claimed in claim 1, wherein the pattern of conductors extends in a first and a second plane, said planes including an angle unequal to 180°.

5. A device as claimed in claim 1, wherein the electrical conductors are mechanically anchored in the body and/or in the attachment layer.

6. A device as claimed in claim 1, further provided with an integrated shield.

7. A device as claimed in claim 1, wherein the body completely surrounds three of the side portions of the electric component and exposes a fourth side portion of the electrical component.

8. A device as claimed in claim 1, wherein the attachment layer comprises insulting material overlaid by the body.

9. A device as claimed in claim 3, wherein the electrically insulating material of the body is an optically transparent material, and there is a light path to the component through the body of transparent material.

10. A device as claimed in claim 4, wherein the conductors at the first plane include contact means for electrical coupling to an external device and said component is coupled to conductors located at the second plane.

11. A device as claimed in claim 8, wherein the pattern of electrical conductors run along a bottom side of the attachment layer that faces away from the electrical component.

12. A device as claimed in claim 8, wherein the attachment layer has two cutout portions overlaid by the electrical component and a bridging portion between the two cutout portions, wherein the bridging portion is overlaid by the electrical component.

13. A device as claimed in claim 10, wherein the component is chosen from the group of optically active and optically sensitive components.

14. A device as claimed in claim 11, wherein the attachment layer has at least one cutout portion overlaid by the electrical component enabling the electrical coupling between the electrical conductors and the electrical component.

* * * * *